(12) United States Patent
Wang et al.

(10) Patent No.: US 12,224,228 B2
(45) Date of Patent: Feb. 11, 2025

(54) PACKAGED COMPONENT WITH COMPOSITE PIN STRUCTURE AND MANUFACTURING METHOD THEREOF

(71) Applicant: PANJIT INTERNATIONAL INC., Kaohsiung (TW)

(72) Inventors: Yung-Hui Wang, Kaohsiung (TW); Chung-Hsiung Ho, Kaohsiung (TW); Chi-Hsueh Li, Tainan (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 440 days.

(21) Appl. No.: 17/741,872

(22) Filed: May 11, 2022

(65) Prior Publication Data

US 2023/0326833 A1 Oct. 12, 2023

(30) Foreign Application Priority Data

Apr. 8, 2022 (TW) .................................. 111113406

(51) Int. Cl.
*H01L 23/49* (2006.01)
*H01L 21/48* (2006.01)
(52) U.S. Cl.
CPC .......... *H01L 23/49* (2013.01); *H01L 21/4889* (2013.01)

(58) Field of Classification Search
CPC ........................................................ H01L 23/49
USPC ............................................................. 257/697
See application file for complete search history.

(56) References Cited

U.S. PATENT DOCUMENTS

2005/0062173 A1* 3/2005 Vu .......................... H01L 24/82
257/737
2006/0059682 A1* 3/2006 Horng ..................... H05K 1/188
29/830

* cited by examiner

*Primary Examiner* — Ajay Arora
(74) *Attorney, Agent, or Firm* — Birch, Stewart, Kolasch & Birch, LLP

(57) ABSTRACT

A method for manufacturing a packaged component with a composite pin structure has: dividing a substrate into a body area and a pin area, wherein a chip is arranged on the body area of the substrate and is electrically connected to conductive layers on the opposite surfaces of the substrate. The pin area is pre-defined with multiple parallel pin positions. After the electrical connection of the chip is completed in the body area, a cutting tool is used to cut along the peripheries of the body area and the pin positions to obtain a packaged component body and multiple pins. Each of the pins is integrally formed by the substrate of the packaged component body without using a conventional lead frame.

14 Claims, 14 Drawing Sheets

PACKAGED COMPONENT WITH COMPOSITE PIN STRUCTURE AND MANUFACTURING METHOD THEREOF

BACKGROUND OF THE INVENTION

1. Field of the Invention

The present invention relates to a packaged device, especially a packaged component with a composite pin structure.

2. Description of the Prior Arts

The pins of conventional semiconductor packaged components are mainly composed of copper lead frames. Taking the power transistor as an example, as shown in FIG. 16, a chip 300 is attached to a pad of a lead frame 301. The lead frame 301 is prefabricated with a plurality of parallel pins 302. After die bonding, a wire bonding step is performed that signal contacts on the chip 300 are electrically connected to different pins 302 on the lead frame 301 through wires 303 respectively, and finally an insulating sealing material 304 is coated on the chip 300.

FIG. 17 and FIG. 18 respectively show the cross-sectional views of different conventional packaged components. For the chip 300 having the signal contacts located on the same plane, the signal contacts on the surface of the chip 300 are connected to the corresponding pins 302 on the lead frame 301 through the wires 303 respectively as shown in FIG. 17. For the chip 300 having the signal contacts respectively located on the surface and the bottom, the wiring will be as shown in FIG. 18. The signal contact on the surface of the chip 300 is connected to one pin 302 through a wire 303, while the other signal contact on the bottom of the chip 300 is connected to another pin of the lead frame 301 through solder such as silver or tin.

Regardless of the packaged components shown in FIGS. 17 and 18, the packaged components of the plating through hole (PTH) type mainly use the pre-formed pins of the lead frame as the pins. But its disadvantage is that it needs to design and manufacture lead frames of different types for different packaged components. For packaging factories, it is necessary to purchase lead frames from suppliers as raw materials, so the cost of packaging production is relatively high.

On the other hand, the overall thickness of the package component is relatively high due to the accumulation of the thickness of the lead frame, the height of the chip, the height of the bonding wire and the thickness of the sealing material. Therefore, it is not easy to thin the conventional package component.

SUMMARY OF THE INVENTION

In view of the above problems, the present invention provides a packaged component with a composite pin structure and a manufacturing method thereof.

A packaged component with a composite pin structure comprises:
 a packaged component body, including a substrate, wherein the substrate is composed of an insulating material body and multiple conductive layers, and the substrate has a chip placement opening for placing a chip;
 multiple pins, extending outward from the packaged component body and electrically connected to the chip, wherein each pin is a composite laminated structure, and the composite laminated structure includes:
 the substrate insulation body integrally extending from the packaged component body;
 the multiple conductive layers, disposed on opposite surfaces of the insulation body of the substrate to electrically connect the chip.

A method for manufacturing a packaged component with a composite pin structure comprises:
 preparing a substrate and dividing the substrate into a body area and a pin area, wherein the pin area is preset with multiple pin positions, the substrate includes an insulation body, and each of the opposite sides of the insulation body has at least one conductive layer;
 forming a chip placement opening and at least one via in the body area;
 placing a chip into the chip placement opening;
 electrically connecting the chip to the conductive layer of the substrate and the via;
 cutting along the edge of the body area and the pin position to form a packaged component body and pins, wherein the body area is formed to a packaged component body, the substrate at the pin position is formed to multiple pins, wherein each pin includes the insulation body and the conductive layers on opposite sides of the insulation body.

The present invention provides chip arrangement on a substrate, and the chip is electrically connected to the conductive layer of the substrate. The substrate can be cut to multiple pins, and the conductive layer on each pin is electrically connected to the chip, thereby forming a thin packaged component without using a conventional lead frame.

DETAILED DESCRIPTION OF THE PREFERRED EMBODIMENTS

Referring to FIGS. 1A to 1D of a first embodiment of the present invention, in the manufacturing process of a packaged component, pins can be formed through a panel level package process without using a metal lead frame as raw material. This embodiment takes a pin through hole (PTH) package as an example.

Figure 1A:
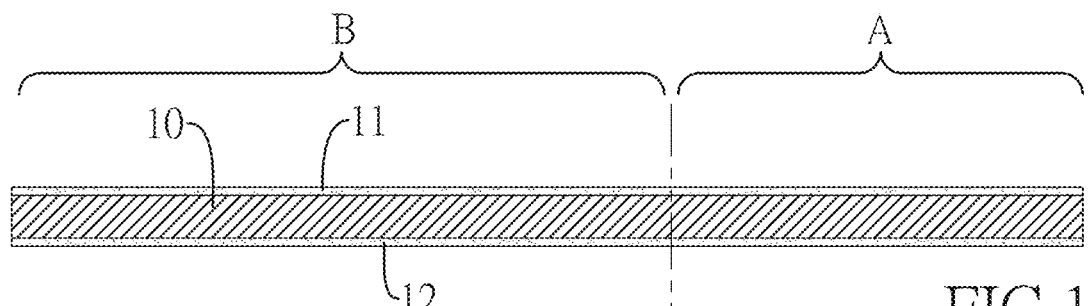
FIGS. 1A to 1E are schematic diagrams of a manufacturing process of a preferred embodiment of the present invention.

Referring to FIG. 1A, in this embodiment, a copper clad laminate (CCL for short) is used as a substrate. The copper clad laminate comprises an insulation body 10 that is laminated with copper foils on upper and lower surfaces of the insulation body 10. The copper foil is used as conductive layers 11 and 12. The substrate can be defined as to include a body area A and a pin area B. The body area A is used for accommodating a chip, forming conductive vias, or making a redistribution layer (RDL) to form the area of the packaged component body. The pin area B is the area where the pins of the packaged component are formed. In the pin area B, the position and quantity of pins are designed according to the product specification.

Figure 1B:
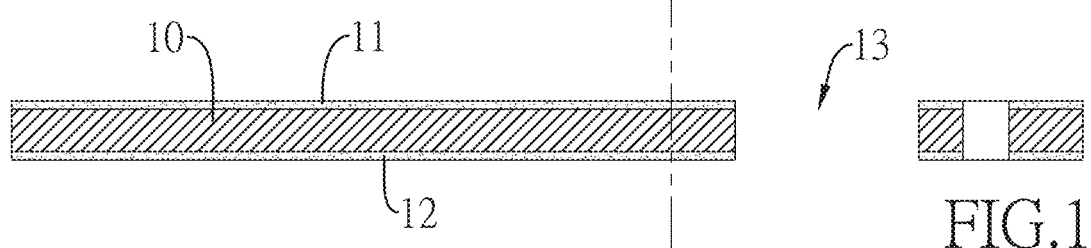
Figure 1C:
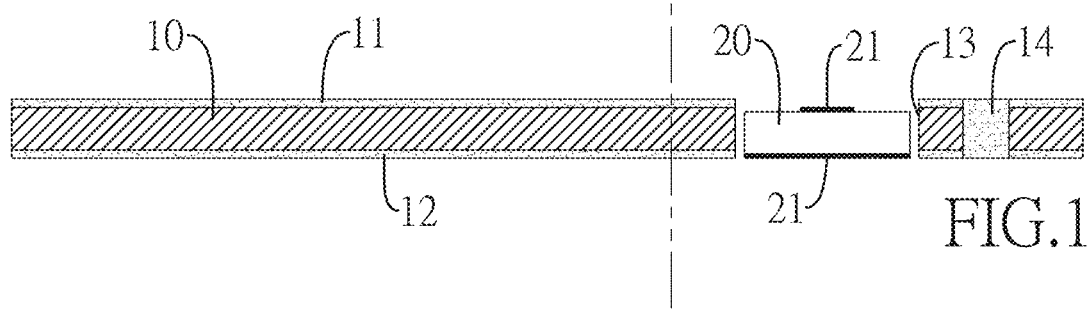

Referring to FIGS. 1B and 1C, a chip placement opening 13 and at least one conductive via 14 are formed in the body area A. The conductive via 14 is electroplated with a conductive material in its inner surface or is filled with a conductive material, so that the conductive via 14 is electrically connected to the conductive layers 11, 12. The chip 20 is placed inside the chip placement opening 13 and has signal contacts 21. The position of the signal contacts 21 may be on the same surface, or respectively on an upper surface and a lower surface of the chip 20. In the embodiment of FIG. 1C, the signal contacts 21 are formed on the upper and lower surfaces of the chip 20 respectively.

Figure 1D:
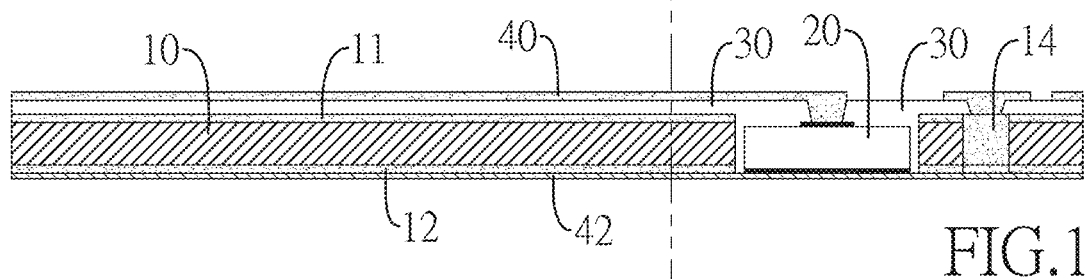

Referring to FIG. 1D, after the chip 20 is placed, different signal contacts 21 are electrically connected to the pin area B. The method for achieving the electrical connection may include electroplating, forming one or more layers of redistribution layers (RDL) and other methods. FIG. 1D only schematically shows that the signal contacts 21 are electrically connected to the conductive layers 11 and 12 of the pin area B. For example, an insulating layer 30 is first formed on the substrate to cover the substrate and the chip 20 and extends to the pin area B. Then, a circuit layer 40 is formed on the surface of the insulating layer 30 through the photolithography process. The circuit layer 40 is electrically connected to the corresponding signal contacts 21 and extends to the pin area B. The signal contacts 21 on the bottom surface of the chip 20 can connect the corresponding conductive layer 12, the conductive via 14 and the like through a bottom circuit layer 42.

Figure 1E:
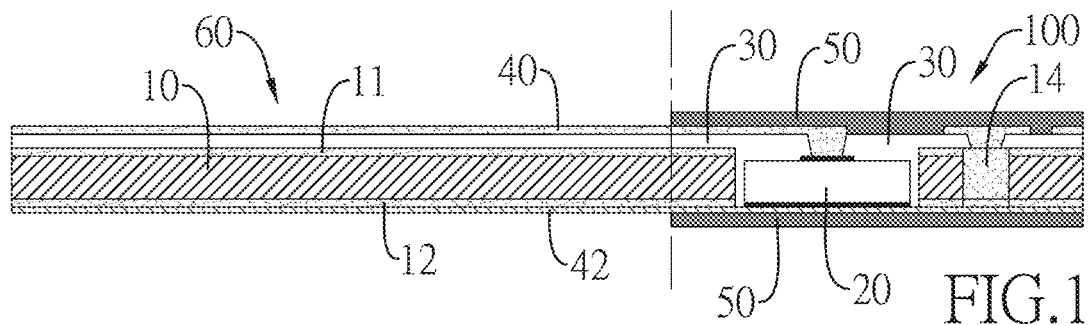

Referring to FIG. 1E, a solder mask layer is formed on the outer surface of the body area A of the substrate as a protective layer 50. The protective layer 50 does extend to cover the pin area B. In this embodiment, a protective layer 50 is formed on each of the upper and lower sides of the body area A of the substrate.

In the previous embodiment, the substrate is a copper clad laminate. In other embodiments, the substrate can be only an insulate substrate made of dielectric material without pre-pressed copper foil on the upper and lower surfaces of the insulate substrate. The conductive circuit layers can be additionally formed on the surfaces of the insulate substrate through the photolithography process, for example, the above-mentioned conductive layers 11, 12 and circuit layer 40, etc. are formed by the photolithography process.

Figure 2A:
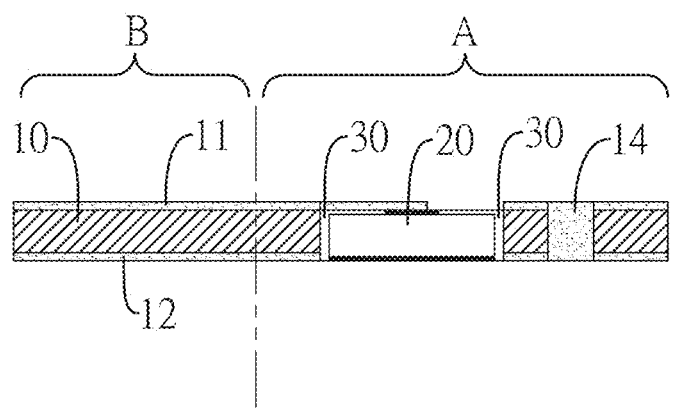
FIGS. 2A-2B are schematic diagrams of part of a manufacturing process of another preferred embodiment of the present invention.
Figure 2B:
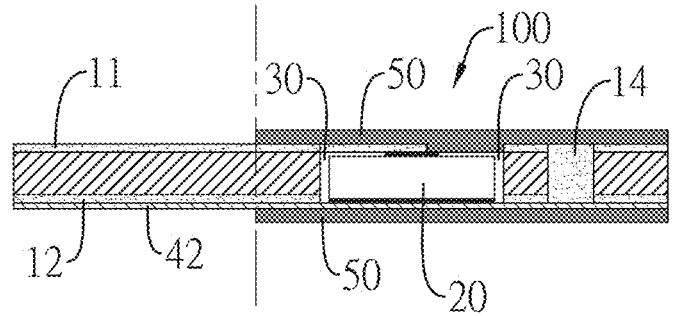

Referring to FIGS. 2A and 2B, in another embodiment, the conductive layers 11, 12 and the bottom circuit layer 42 on the upper and lower surfaces of the substrate can be used to electrically connect to the chip 20 without making additional circuit layers 40.

Figure 3:
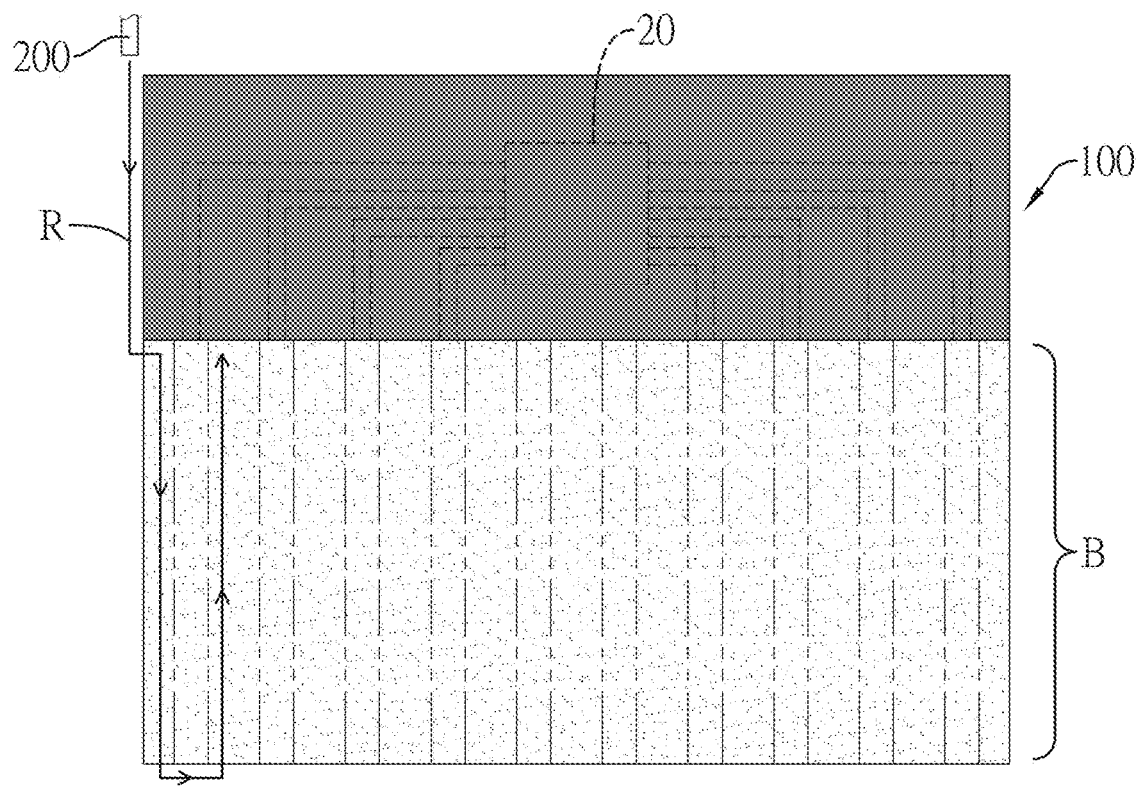
FIG. 3 is a schematic diagram of the operation of pin cutting according to a preferred embodiment of the present invention.
Figure 4:
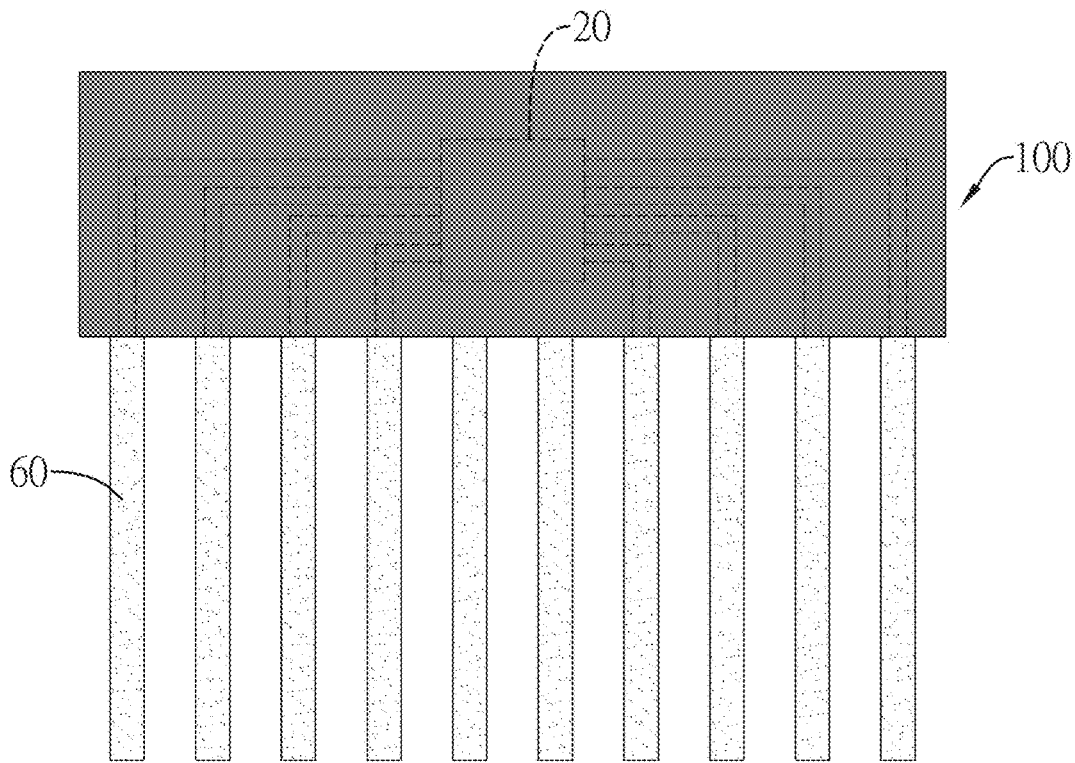
FIG. 4 is a schematic plan view of a preferred embodiment of the present invention.

Referring to FIG. 3 and FIG. 4, a cutting tool is used to saw the body area A and the pin area B of the substrate. A packaged component body 100 in a rectangular shape is formed after cutting along the edge of the body area A. The pin forming operation is performed in the pin area B. Pre-defined pin positions are reserved and unnecessary areas in the substrate 10 are removed. The remaining substrate, i.e. the pre-defined pin positons, form a plurality of pins 60 of the packaged component. The left side of FIGS. 1A to 1E only show the lateral side view structure of a single pin 60. In fact, the packaged component has multiple pins 60 in parallel. In this embodiment, the pins 60 can be formed by cutting the substrate with a routing machine. Other methods such as punching and laser cutting can also be used to form the pins 60. For example, a milling cutter 200 is controlled to move along the cutting path R in FIG. 3, that is, along the edge of the pre-defined positions of the pins 60.

Figure 5:
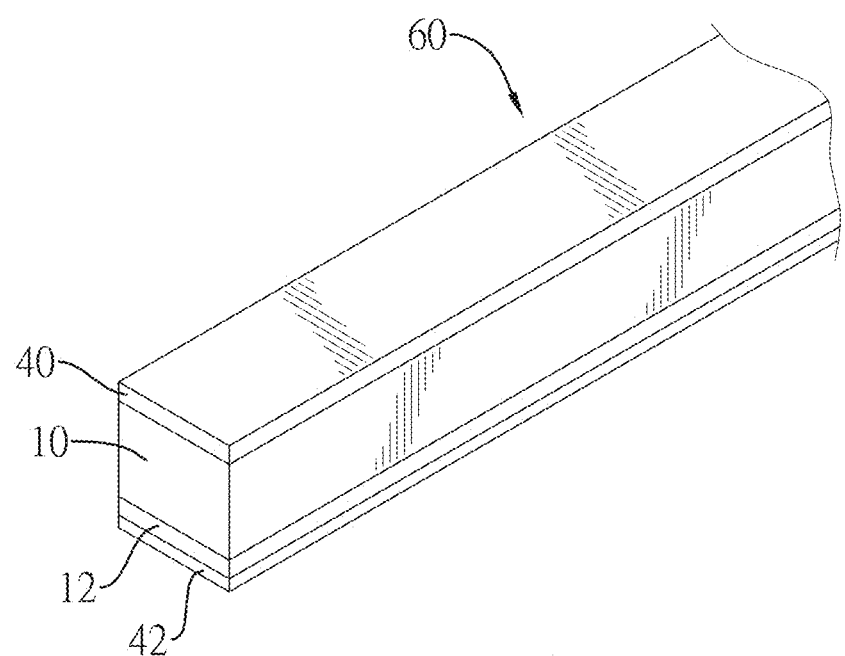
FIG. 5 is a partial enlarged view of the pin of the present invention.
Figure 6A:
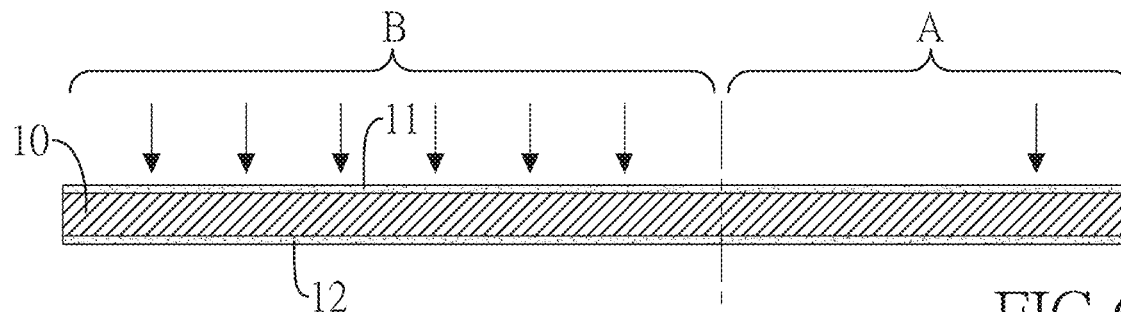
FIGS. 6A to 6E are schematic diagrams of the fabrication process of another preferred embodiment of the present invention.
Figure 6B:
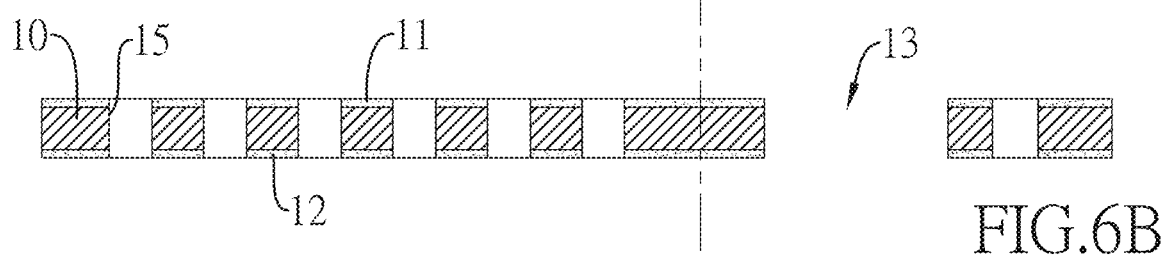
Figure 6C:
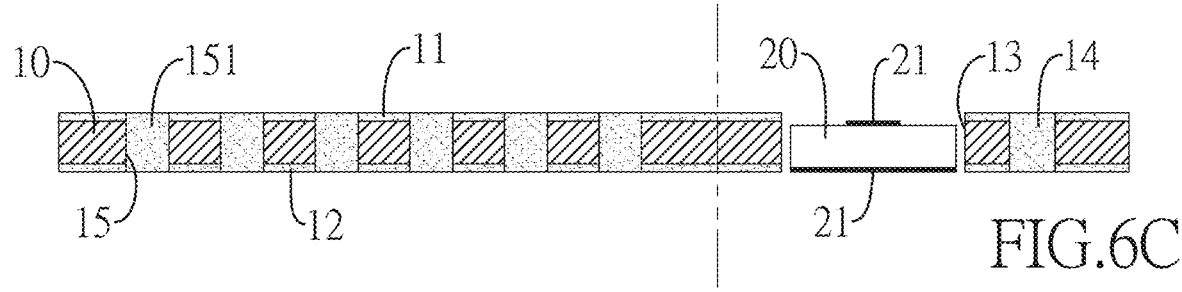
Figure 6D:
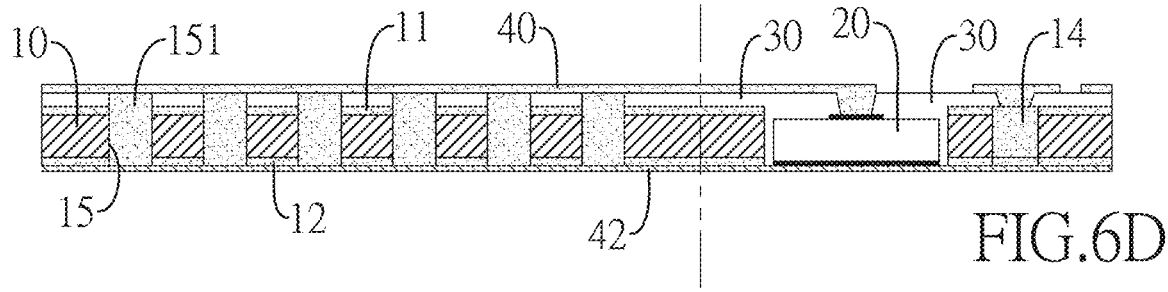
Figure 6E:
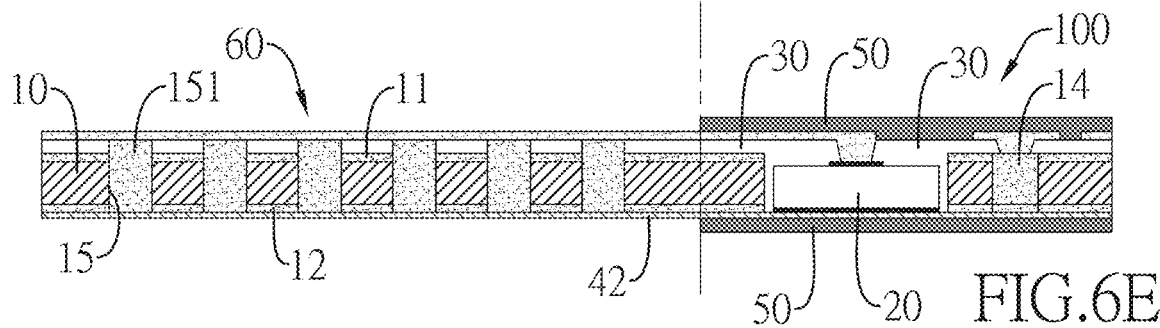

The structure of each pin 60 is shown in FIG. 5, including at least the insulation body 10 in the middle and the conductive layers on the opposite sides of the insulation body 10. The conductive layer may be the copper foil layer 12 of the insulation body 10, the circuit layer 40 and/or the bottom circuit layer 42. Each pin 60 is electrically connected to the chip 20 through the conductive layer. Because the pins 60 are formed by cutting the substrate 10, the length/width of the pins 60 and the pitch between adjacent pins 60 can be determined according to the specifications of the product, which are not limited by the conventional lead frame. The thickness of each pin 60 or the thickness of the conductive layers can also be adjusted. For example, the thickness of the pins 60 can be increased by stacking the insulating layer 30 or the circuit layer or making a thicker circuit layer 40 by electroplating.

Figure 7:
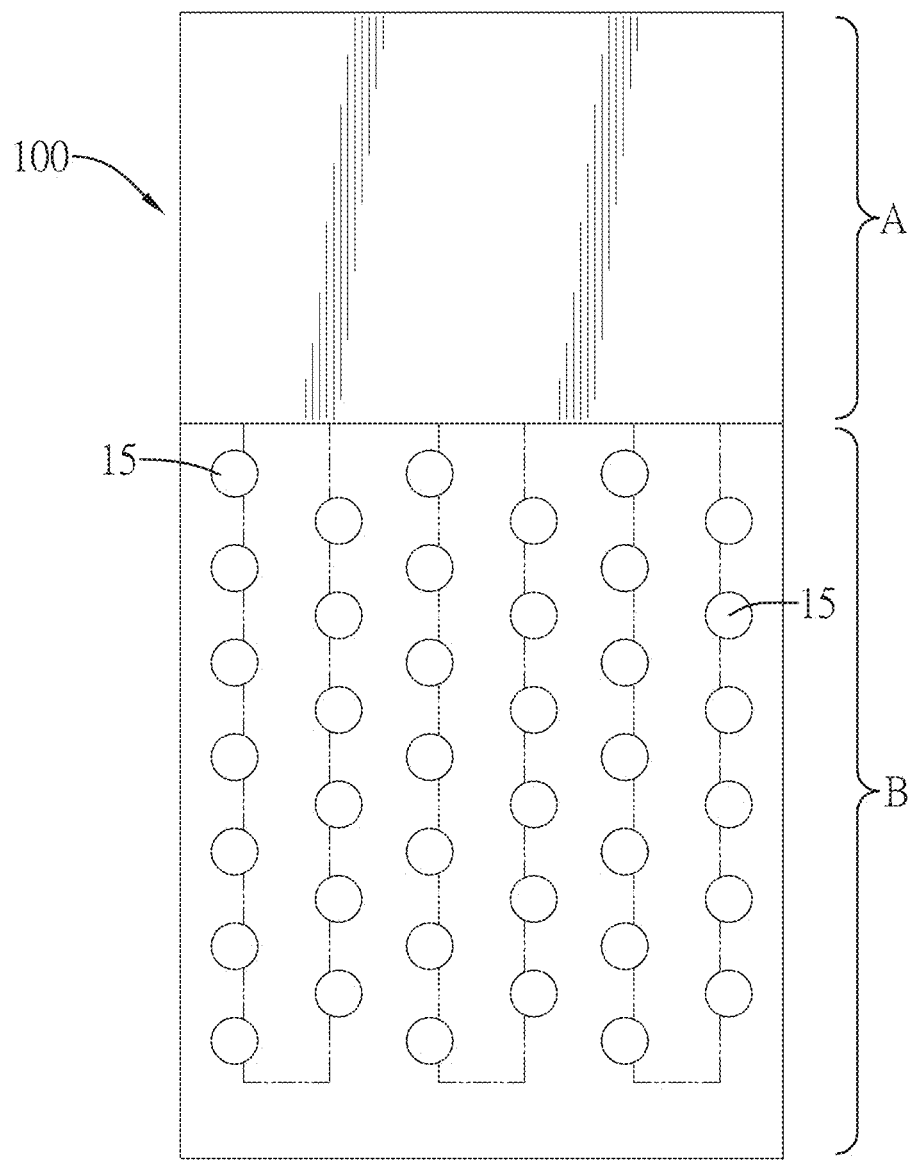
FIG. 7 is a schematic plan view of the embodiment of FIGS. 6A to 6E after through holes are formed in the pin area.
Figure 8:
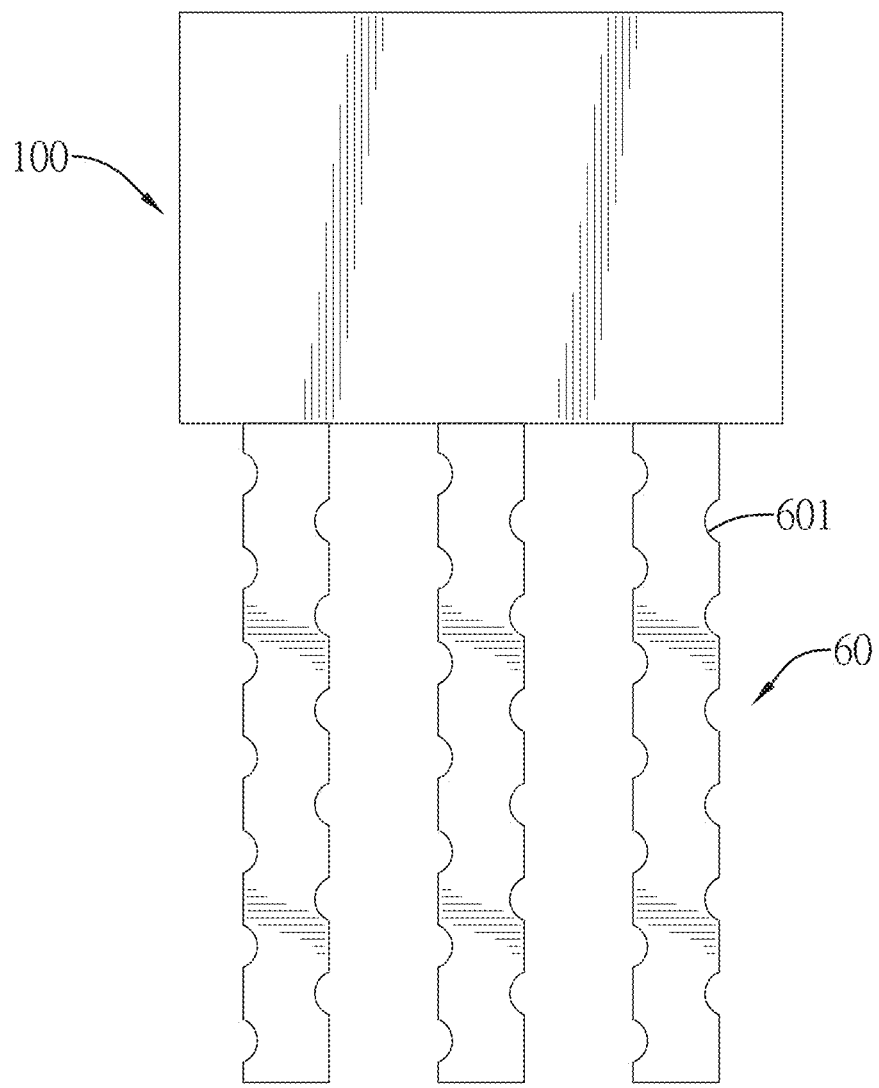
FIG. 8 is a schematic plan view of the embodiment of FIGS. 6A to 6E after pin cutting is completed.
Figure 9:
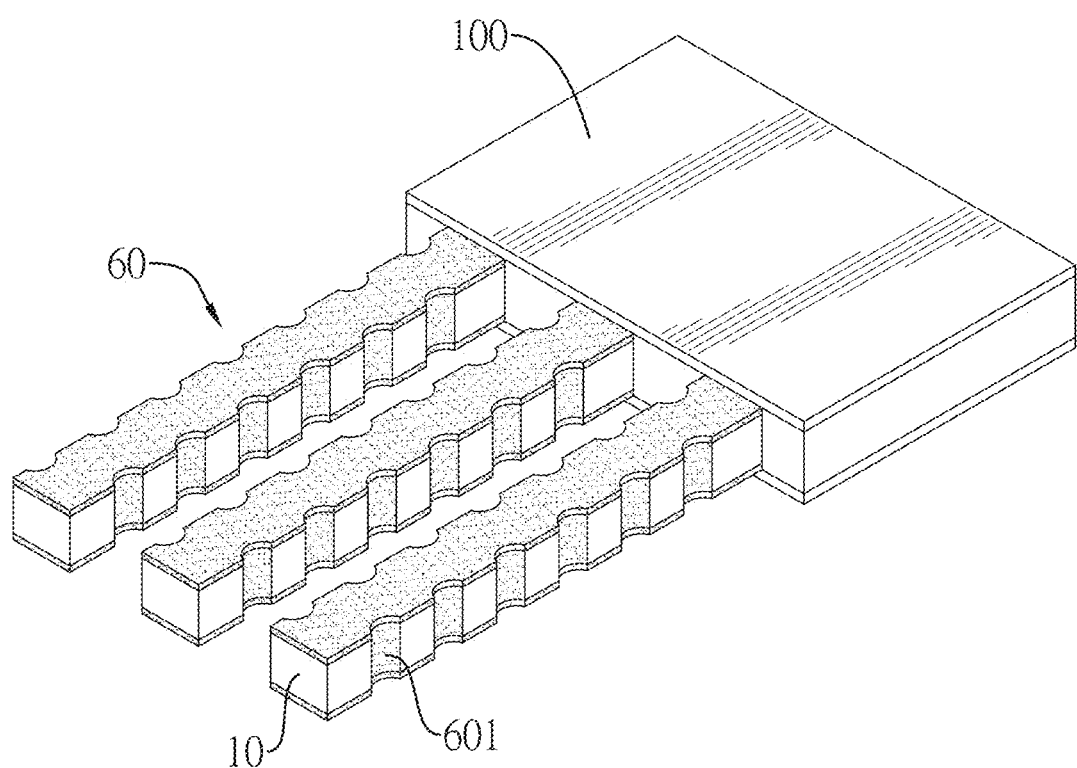
FIG. 9 is a three-dimensional schematic diagram of the embodiment of FIGS. 6A to 6E after the pins are cut.

FIGS. 6A to 6E show another embodiment of the present invention, which differs from the embodiment of FIGS. 1A to 1E in that multiple through holes 15 are formed in the pin area B by mechanical drilling (as shown by arrows) in advance. Referring to FIG. 7, the positions of the through holes 15 are distributed on the edge of each pin position, and a plating layer 151 is plated on the inner surface of each through hole 15. When the pin forming step is performed in the pin area B, the cutting tool cuts along the edges of the pins 60 and simultaneously cuts each through hole 15. Referring to FIGS. 8 and 9, the through holes 15 have been cut naturally to form concave curved notches 601 on opposite sides of the pin 60. The surface of each notch 601 has the plating layer 151 to increase the soldering area on the side of each pin 60 and improve the solderability of the packaged components. In this embodiment, the through hole 15 in the pin area B and the conductive via 14 in the body area A are formed and plated simultaneously. Therefore, additional drilling and electroplating steps are not required after the pins 60 are formed, which can simplify the process steps. However, in other embodiments, the entire surface of the pins 60 may be electroplated after the pins 60 are formed, so that more areas of the surfaces of the pins 60 can contact the solder.

Figure 10:
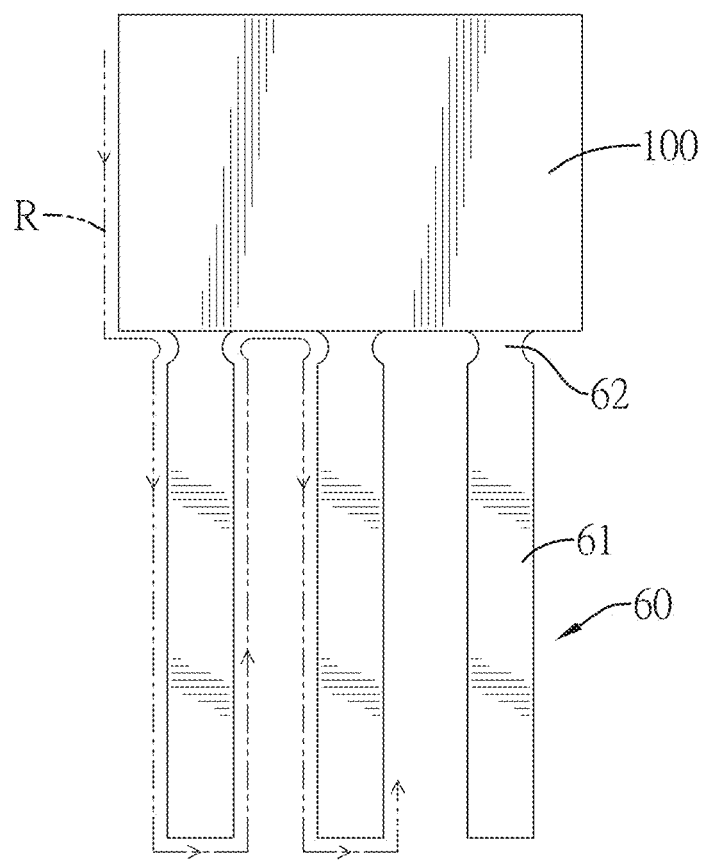
FIG. 10 is a schematic plan view of another embodiment of the pin of the present invention.
Figure 11:
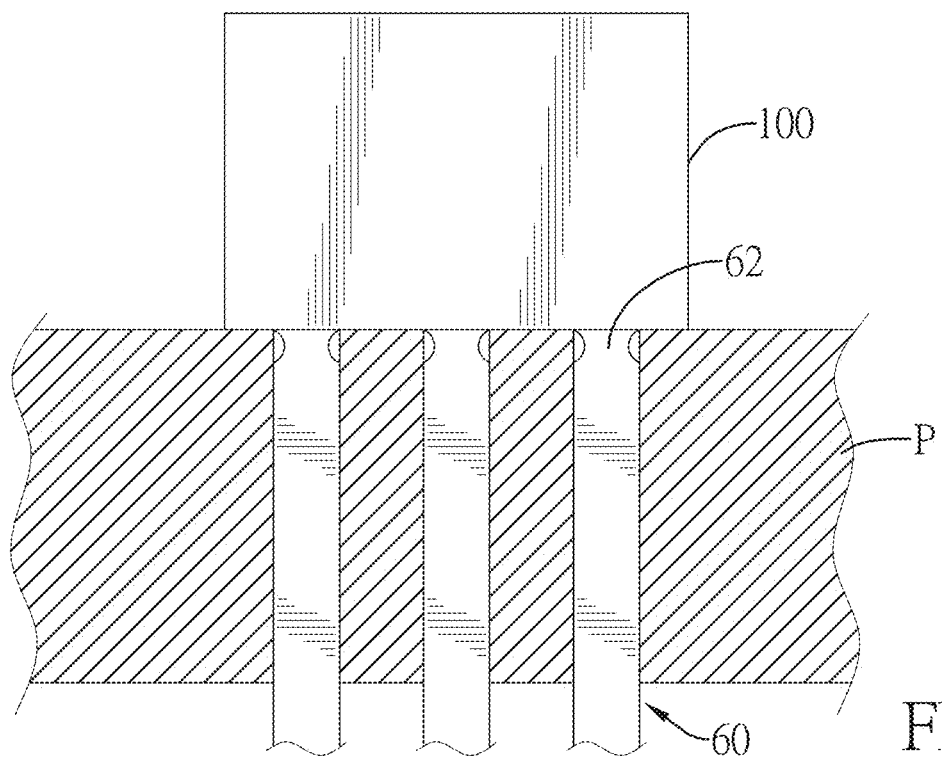
FIG. 11 is a schematic diagram of the pins plugged into the circuit board shown in FIG. 10.

Referring to FIGS. 10 and 11, in the step of forming pins, the pin 60 forms a pin body 61 and a neck portion 62. One end of the neck portion 62 is connected to the bottom surface of the packaged component body 100, and the other end is connected to the pin body 61. The width of the neck portion 62 is slightly smaller than the width of the pin body 61. Because the width of the neck portion 62 is also smaller than the diameter of the pin hole on the circuit board P, when the pins 60 are inserted into the pin holes of the circuit board P, the bottom surface of the packaged component body 100 can be flat on the surface of the circuit board P. This embodiment can improve the stability of the surface mount technology (SMT) component when it is soldered to the surface of the circuit board, to prevent the packaged component from shaking or swaying on the circuit board P. When making the neck portion 62, a milling cutter can be used to cut along the cutting path R as shown in FIG. 10. When the milling cutter moves to the junction between the pin 60 and the bottom surface of the packaged component body 100, the milling cutter is controlled to move toward the center of the pin 60 to slightly cut the top of the pin 60, and then the milling cutter is drawn back to cut along the edge of the pin 60 to form the neck portion 62.

Figure 12:
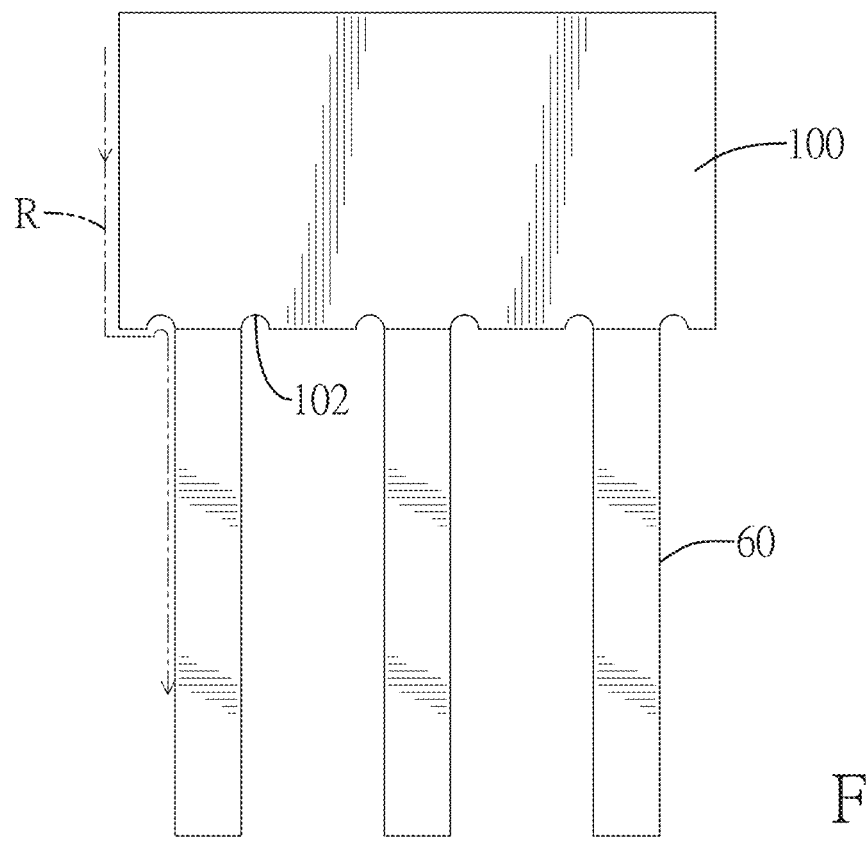
FIG. 12 is a schematic plan view of another embodiment of the pin of the present invention.
Figure 13:
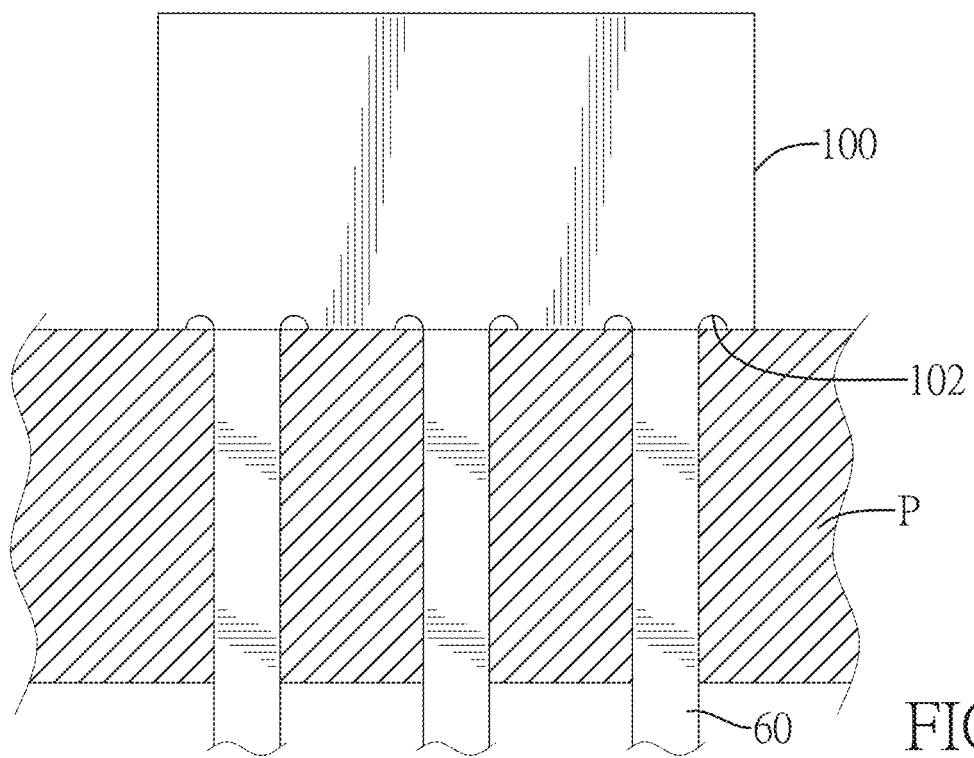
FIG. 13 is a schematic diagram of the pins plugged into the circuit board shown in FIG. 12.

Referring again to FIGS. 12 and 13, in the step of forming pins, grooves 102 may also be formed inwardly on the bottom surface of the packaged component body 100, and the grooves 102 are located on opposite sides of each pin 60. Similarly, when the pins 60 are inserted into the circuit board P, the bottom surface of the packaged component body 100 can be flat on the surface of the circuit board P, so that the packaged component can be attached onto the circuit board P steadily. The space, which is formed by the groove 102, between the packaged component body 100 and the surface of the circuit board P can also increase the heat dissipation effect. The groove 102 can be formed by cutting along the cutting path R shown in FIG. 12 with a milling cutter. When the milling cutter moves to the interface between the pins 60 and the packaged component body 100, the milling cutter is controlled to purposely move toward the bottom surface of the packaged component body 100. Then the milling cutter is moved back and then cut along the edge of the pin 60, and the groove 102 can be formed on the bottom surface of the package component body 100.

Figure 14:
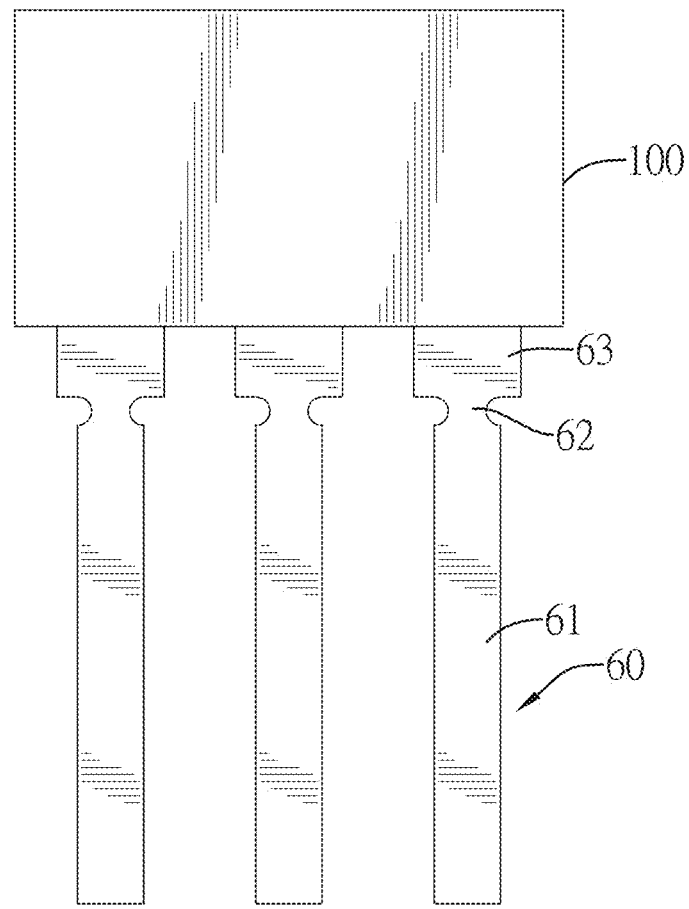
FIG. 14 is a schematic plan view of another embodiment of the pin of the present invention.
Figure 15:
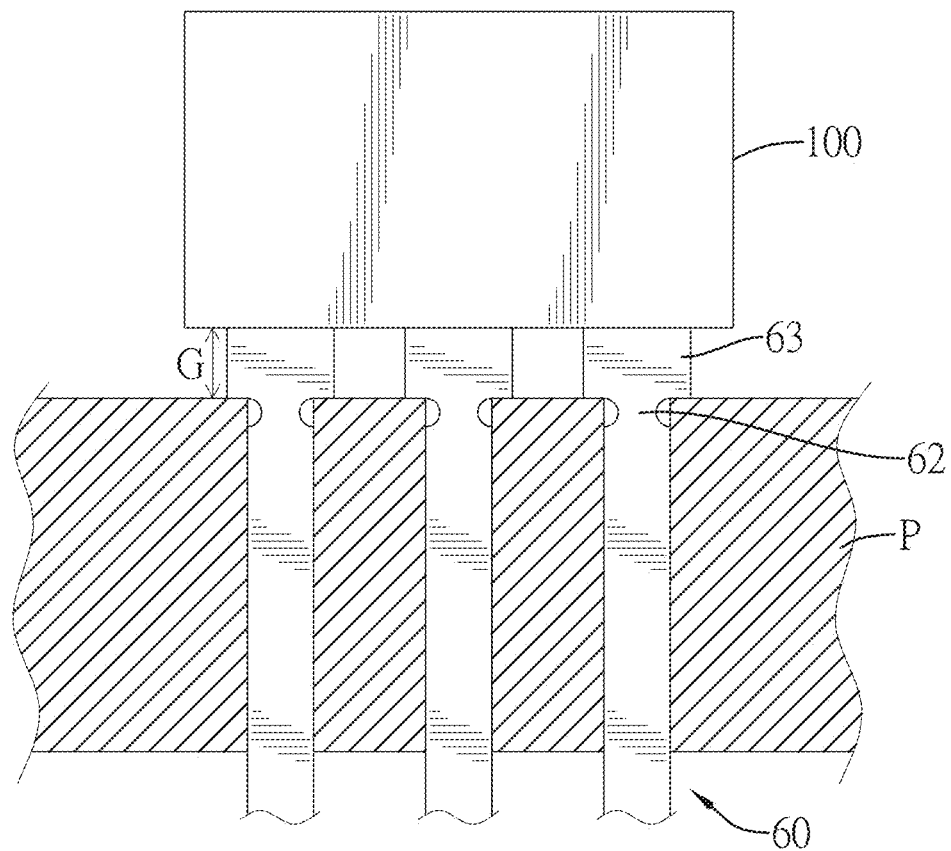
FIG. 15 is a schematic diagram of the pins plugged into the circuit board shown in FIG. 14.
Figure 16:
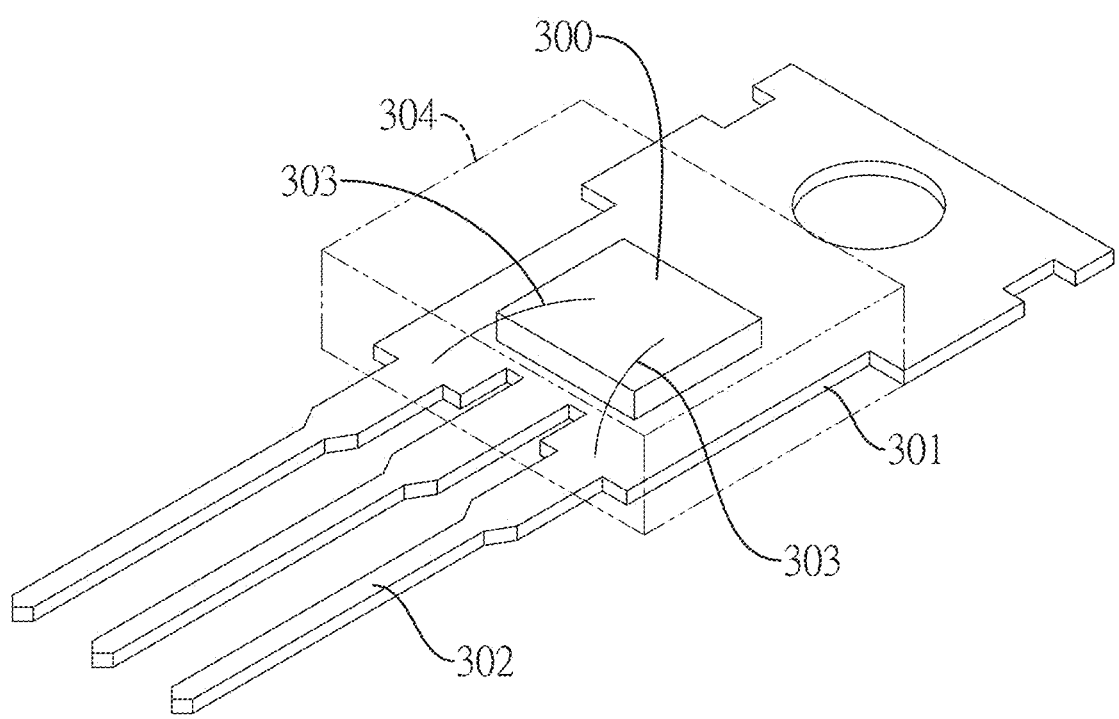
FIG. 16 is a schematic perspective view of a conventional power transistor.
Figure 17:
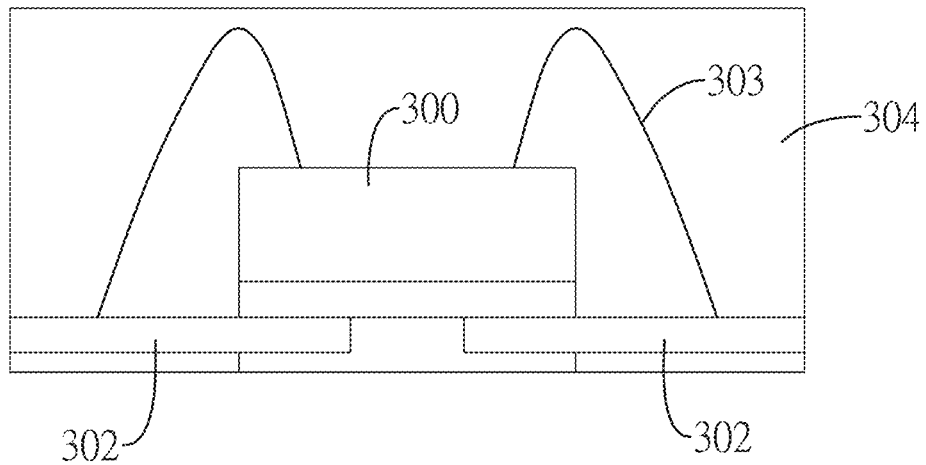
FIG. 17 is a schematic cross-sectional view of a conventional horizontal packaged component.
Figure 18:
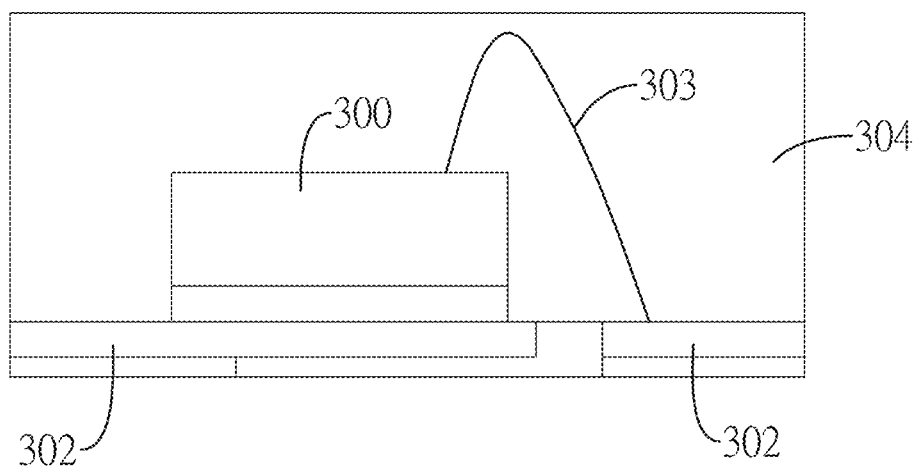
FIG. 18 is a schematic cross-sectional view of a conventional vertical packaged component.

Referring to FIGS. 14 and 15, in comparison to the embodiment of FIG. 10, the pin 60 further forms a support portion 63. The support portion 63 extends from the bottom surface of the packaged component body 100. The width of the support portion 63 is slightly enlarged to be larger than that of the pin body. 61 and larger than the diameter of the pin hole on the circuit board P. The neck portion 62 is formed at the bottom end of the supporting portion 63, and the width of the neck portion 62 is smaller than the diameter of the pin hole on the circuit board P. When the packaged component is inserted into the circuit board P, the lower edge of the support portion 63 abuts the surface of the circuit board P, so that a heat dissipation gap G is formed between the bottom surface of the packaged component body 100 and the circuit board P. The neck portion 62 can enter the pin hole. Due to the heat dissipation gap G between the packaged component body 100 and the surface of the circuit board P, the heat dissipation effect can be further improved.

Based on the above, the embodiments of the present invention have one or more of the following advantages:
1. The present invention manufactures the package component through the panel level package (PLP) technology, and can manufacture the pins of the package component without lead frames.
2. Compared with the conventional package components, the present invention can effectively reduce the overall thickness of the packaged component because it does not need lead frames, wire bonding and molding, which is helpful for reducing the product volume and improving the heat dissipation effect.
3. As curved notches are formed on the side of the pin, the soldering area can be increased and the solderability of the product can be improved.
4. The molded product can be inspected by the automatic optical inspection (AOI) instrument to check whether the appearance has defects.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. A packaged component with a composite pin structure, comprising:
    a substrate having a body area and a pin area, wherein the substrate comprises an insulation body and multiple conductive layers, and the body area of the substrate is formed with a chip placement opening;
    a chip placed in the chip placement opening;
    a protective layer covering the body area to form peripheral surfaces of a packaged component body;
    the pin area having multiple pins, extending outward from the packaged component body and electrically connected to the chip, wherein each of the multiple pins has a composite laminated structure, and the composite laminated structure includes:
    the insulation body integrally extending from the packaged component body;
    the multiple conductive layers, disposed on opposite surfaces of the insulation body of the substrate to electrically connect the chip.

2. The packaged component with a composite pin structure as claimed in claim 1, wherein two opposite surfaces of the packaged component body each respectively have the protective layer.

3. The packaged component with a composite pin structure as claimed in claim 1, wherein, the packaged component body has at least one conductive via formed inside, and the at least one conductive via is electrically connected to at least one of the multiple conductive layers.

4. The packaged component with a composite pin structure as claimed in claim 1, wherein multiple curved notches are formed on sides of each pin, and a plating layer is formed on a surface of each curved notch.

5. The packaged component with a composite pin structure as claimed in claim 1, wherein each pin includes a neck portion and a pin body; one end of the neck portion is connected to the packaged component body, and the other end of the neck portion is connected to the pin body; and a width of the neck portion is smaller than a width of the pin body.

6. The packaged component with a composite pin structure as claimed in claim 1, wherein the packaged component body is formed with multiple grooves on a surface from which the multiple pins extend outwardly, and every two of the multiple grooves are respectively adjacent to opposite sides of each pin.

7. The packaged component with a composite pin structure as claimed in claim 1, wherein each pin includes a support portion, a neck portion and a pin body extending in sequence, and one end of the support portion is connected to the packaged component body; and the support portion is wider than the pin body, and the pin body is wider than the neck portion.

8. A method for manufacturing a packaged component with a composite pin structure, comprising:

preparing a substrate and dividing the substrate into a body area and a pin area, wherein the pin area is pre-defined with multiple pin positions, the substrate includes an insulation body having opposite surfaces, and at least one conductive layer is formed on each of the opposite surfaces;

forming a chip placement opening and at least one conductive via in the body area;

placing a chip into the chip placement opening;

electrically connecting the chip to the at least one conductive layer of the substrate and the at least one conductive via;

a protective layer covering the body area to form peripheral surfaces of a packaged component body;

cutting along a periphery of the body area to form the packaged component body, and along a periphery of the multiple pin positions to form multiple pins extending from the packaged component body;

wherein each pin comprises the insulation body and the at least one conductive layer on the opposite surfaces of the insulation body.

9. The method as claimed in claim 8, wherein the step of electrically connecting the chip to the at least one conductive layer of the substrate includes:

forming an insulating layer on a surface of the substrate, wherein the insulating layer covers the chip;

forming a circuit layer on the insulating layer, wherein the circuit layer is electrically connected to the chip and extends to each pin position.

10. The method as claimed in claim 9, wherein the protective layer comprises layers that are respectively formed above the circuit layer and below the substrate in the body area.

11. The method as claimed in claim 8, wherein, when forming the chip placement opening and the at least one conductive via in the body area, multiple conductive vias are formed in the pin area and a conductive layer is formed on an inner surface of each conductive via, and the multiple conductive vias are distributed along an edge of the pin position; and in the step of forming the pins, the conductive vias are cut to form multiple curved notches on the sides of each pin.

12. The method as claimed in claim 8, wherein, in the step of forming the pins, one end of each pin adjacent to the packaged component body is partially cut to form a neck portion.

13. The method as claimed in claim 8, wherein, in the step of forming the pins, a surface of the packaged component connected to the pins is partially cut to form grooves, and every two of the multiple grooves are respectively adjacent to opposite sides of each pin.

14. The method as claimed in claim 8, wherein in the step of forming the pins, each pin includes a support portion, a neck portion and a pin body extending in sequence, and one end of the support portion is connected to the packaged component body;

the support portion is wider than the pin body, and the pin body is wider than the neck portion.

* * * * *